(12) United States Patent
Kajiyama et al.

(10) Patent No.: US 8,922,752 B2
(45) Date of Patent: *Dec. 30, 2014

(54) METHOD AND APPARATUS FOR ALIGNMENT PROCESSING

(71) Applicant: V Technology Co., Ltd., Yokohama (JP)

(72) Inventors: Koichi Kajiyama, Yokohama (JP);
Toshinari Arai, Yokohama (JP);
Michinobu Mizumura, Yokohama (JP)

(73) Assignee: V Technology Co., Ltd., Kanagawa (JP)

( * ) Notice: Subject to any disclaimer, the term of this patent is extended or adjusted under 35 U.S.C. 154(b) by 150 days.

This patent is subject to a terminal disclaimer.

(21) Appl. No.: 13/657,468

(22) Filed: Oct. 22, 2012

(65) Prior Publication Data
US 2013/0100431 A1    Apr. 25, 2013

Related U.S. Application Data

(63) Continuation of application No. PCT/JP2011/059435, filed on Apr. 15, 2011.

(30) Foreign Application Priority Data

Apr. 23, 2010 (JP) .................................. 2010-100053

(51) Int. Cl.
*G03F 9/00*    (2006.01)
*G03F 7/20*    (2006.01)
*G02F 1/13*    (2006.01)
*G02F 1/1337*    (2006.01)

(52) U.S. Cl.
CPC .......... *G03F 9/7084* (2013.01); *G03F 7/70566* (2013.01); *G03F 7/7035* (2013.01); *G02F 1/13* (2013.01); *G02F 1/1337* (2013.01); *G02F 1/133788* (2013.01)
USPC .................... 355/71; 355/67; 355/77; 355/78; 355/84; 349/124; 349/129

(58) Field of Classification Search
CPC ............ G02F 1/1337; G02F 1/133753; G02F 1/133788; G02F 1/13; G03F 7/7035; G03F 7/70566; G03F 9/7084

USPC ........ 349/94, 123, 124, 129, 134; 355/67, 71, 355/77, 78, 84
See application file for complete search history.

(56) References Cited

U.S. PATENT DOCUMENTS

2003/0025864 A1    2/2003    Chida et al.
2010/0035190 A1*    2/2010    Jung et al. ..................... 430/322

(Continued)

FOREIGN PATENT DOCUMENTS

CN    101390008 A    3/2009
CN    101765806 A    6/2010

(Continued)

OTHER PUBLICATIONS

PCT Notification of Transmittal of Translation of the International Preliminary Report on Patentability and Written Opinion of the International Searching Authority, PCT/JP2011/059435, dated Dec. 13, 2012.

(Continued)

*Primary Examiner* — Colin Kreutzer
(74) *Attorney, Agent, or Firm* — Finnegan, Henderson, Farabow, Garrett & Dunner, L.L.P.

(57) ABSTRACT

A method for alignment processing including making a substrate 4, coated with an aligned film, closely face the photo mask 7 having a first mask pattern group having a plurality of elongated first openings formed at a fixed array pitch and a second mask pattern group provided in parallel with the first mask pattern group and having a plurality of elongated second openings formed at the same pitch as the array pitch of the first openings and moving the substrate in a direction crossing the first and second mask pattern groups, applying P polarizations with different incidence angles θ to the first and second mask pattern groups of the photo mask, and alternately forming, on the aligned film, first and second slit alignment regions in different aligned states.

10 Claims, 10 Drawing Sheets

(56) References Cited

U.S. PATENT DOCUMENTS

| | | | |
|---|---|---|---|
| 2010/0188623 A1* | 7/2010 | Nakagawa | 349/96 |
| 2010/0225864 A1 | 9/2010 | Inoue et al. | |
| 2011/0217638 A1* | 9/2011 | Kim et al. | 430/20 |
| 2012/0064441 A1* | 3/2012 | Tanaka | 430/5 |
| 2013/0271742 A1* | 10/2013 | Mizumura | 355/71 |

FOREIGN PATENT DOCUMENTS

| | | |
|---|---|---|
| JP | 11-133429 | 5/1999 |
| JP | 2002-31804 | 1/2002 |
| JP | 2003-043492 | 2/2003 |
| JP | 2007-041175 | 2/2007 |
| JP | 4201862 | 10/2008 |
| JP | 2010-39485 A | 2/2010 |
| WO | WO 2007/086474 A1 | 8/2007 |
| WO | WO 2009/037889 A1 | 3/2009 |
| WO | WO 2010137402 A1 * | 12/2010 |

OTHER PUBLICATIONS

PCT Notification Concerning Transmittal of International Preliminary Report on Patentability (Chapter I of the Patent Cooperation Treaty), dated Nov. 1, 2012.

Office Action issued by Japanese Patent Office for corresponding Japanese Patent Application No. 2010-100053, dated Feb. 25, 2014.

English-language translation of International Search Report from the Japanese Patent Office for International Application No. PCT/JP2011/059435, mailing date Jun. 7, 2011.

Office Action issued by Japanese Patent Office for corresponding Japanese Patent Application No. 2010100053.

* cited by examiner

METHOD AND APPARATUS FOR ALIGNMENT PROCESSING

This application is a continuation of PCT/JP2011/059435, filed on Apr. 15, 2011.

BACKGROUND OF THE INVENTION

1. Field of the Invention

The present invention relates to a method for alignment processing of alternately forming two kinds of slit alignment regions in different aligned states while moving a substrate and relates specifically to a method and an apparatus for alignment processing that can reduce takt time of the alignment processing.

2. Description of Related Art

In this type of conventional method for alignment processing, a photo mask in which slit openings are formed at a fixed array pitch is used, and first ultraviolet irradiation is applied to a substrate coated with an aligned film from an oblique direction. After that, the substrate or both the substrate and the photo mask are rotated 180 degrees to shift a relative position of the photo mask to the substrate, and, thus, to apply second ultraviolet irradiation to a region not subjected to the first ultraviolet irradiation (for example, see Japanese Patent No. 4201862).

In another method for alignment processing, a photo mask in which slit openings are formed at a fixed array pitch is used, and ultraviolet light is irradiated to an aligned film on a substrate from a 45° direction with respect to the perpendicular of the substrate through the openings of the photo mask. The photo mask is then shifted, and polarized ultraviolet light is irradiated from a 45° opposite direction with respect to the perpendicular of the substrate (for example, see Japanese Laid-open (Kokai) Patent Application Publication No. 2002-31804).

In yet another method for alignment processing, while a color filter substrate is moved along its surface direction, ultraviolet light is irradiated to the color filter substrate coated with an aligned film from an oblique direction through a photo mask in which a plurality of openings are formed at a fixed array pitch in a direction perpendicular to the moving direction of the color filter substrate, and half of the region of each picture element of the color filter substrate is exposed. After that, the exposure position is shifted by a half pitch, and the irradiation angle of ultraviolet light is changed to expose a remaining half of the region of each picture element (for example, see Japanese Laid-open (Kokai) Patent Application Publication No. 2007-41175).

However, in any of the above conventional methods for alignment processing, since two kinds of alignment regions in different aligned states are formed through two times of alignment processing, the takt time of the alignment processing cannot be reduced.

In the method for alignment processing disclosed in Patent Literature 1, after the first ultraviolet irradiation, the substrate is rotated 180 degrees to apply the second ultraviolet irradiation to the region not subjected to the first ultraviolet irradiation. Therefore, two different photo masks, that is, the photo mask for the first ultraviolet irradiation and the photo mask for the second ultraviolet irradiation are required to be used, and there is a problem that the cost of the photo mask is increased.

In the method for alignment processing disclosed in Patent Literatures 1 and 2, since the alignment processing is batch processing, it is difficult to increase the number of substrates subjected to the alignment processing per unit of time.

In the method for alignment processing disclosed in Patent Literature 3, although the alignment processing can be performed while the substrates are continuously supplied, two apparatuses for alignment processing are required to be provided to be arranged in the moving direction of the substrate, and there is a problem that the cost of the device is increased.

SUMMARY OF THE INVENTION

Thus, in order to deal with the above problems, the present invention provides a method and an apparatus for alignment processing that can reduce the takt time of the alignment processing by forming two kinds of slit alignment regions in different aligned states through a single alignment processing.

In order to achieve the object, the present invention provides a method for alignment processing including: making a substrate, coated with an aligned film, closely face a photo mask, which has a first mask pattern group having a plurality of first elongated openings formed at a fixed array pitch and a second mask pattern group provided parallel to the first mask pattern group and having a plurality of second elongated openings formed at the same pitch as the array pitch of the first openings, and moving the substrate in a direction crossing the first and second mask pattern groups; applying polarizations whose at least one of polarization direction and incidence angle is different to the first and second mask pattern groups of the photo mask; and alternately forming, on the aligned film, first and second slit alignment regions in different aligned states.

In addition, the first mask pattern group of the photo mask has a plurality of first openings elongated in a moving direction of the substrate and formed at a fixed array pitch in a direction crossing the moving direction of the substrate, the second mask pattern group is provided in parallel at a fixed distance in the moving direction of the substrate with respect to the first mask pattern group and has a plurality of second openings elongated in the moving direction of the substrate and formed at the same pitch as the array pitch of the first openings while shifting the second openings by a half pitch in an array direction, and the first and second slit alignment regions parallel to the moving direction of the substrate are alternately formed in a direction crossing the moving direction of the substrate. Consequently, the first and second slit alignment regions parallel to the moving direction of the substrate are alternately formed in a direction crossing the moving direction of the substrate.

In addition, the first and second mask pattern groups of the photo mask have a plurality of openings elongated in a direction crossing the moving direction of the substrate and formed at a fixed array pitch in the moving direction of the substrate and are provided in parallel away from each other in the moving direction of the substrate by a distance which is the integral multiple of half of the array pitch, and the first and second slit alignment regions crossing the moving direction of the substrate are alternately formed in the moving direction of the substrate by intermittently applying the polarization for each movement of the substrate by a distance equal to the array pitch. Consequently, the first and second slit alignment regions crossing the moving direction of the substrate are alternately formed in the moving direction of the substrate.

Moreover, the polarizations applied to the first and second mask pattern groups of the photo mask are P polarizations, and the incidence angles are different from each other. Consequently, the P polarizations are made to enter the first and second mask pattern groups of the photo mask at different angles from each other.

And then, one of the polarizations applied to the first and second mask pattern groups of the photo mask is P polarization, and the other is S polarization. Consequently, the P polarization is applied to one of the first and second mask pattern groups of the photo mask, and the S polarization is applied to the other of them.

The present invention also provides an apparatus for alignment processing including: a conveyance means which places a substrate, coated with an aligned film, on an upper surface of the conveyance means and moves the substrate in a given direction; a mask stage which is disposed so as to face the upper surface of the conveyance means and holds a photo mask having a first mask pattern group having a plurality of elongated first openings formed at a fixed array pitch and a second mask pattern group provided in parallel with the first mask pattern group and having a plurality of elongated second openings formed at the same pitch as the array pitch of the first openings; and a polarization optical system which applies polarizations whose at least one of polarization direction and incidence angle is different to the first and second mask pattern groups of the photo mask, wherein first and second slit alignment regions in different aligned states are allowed to be alternately formed on the aligned film.

According to the above constitution, a photo mask having a first mask pattern group in which a plurality of elongated openings are formed in a mask stage at a fixed array pitch and a second mask pattern group provided in parallel with the first mask pattern group and having a plurality of elongated openings formed at the same pitch as the array pitch of the above plurality of the openings is held, a substrate coated with an aligned film is moved in a direction crossing the first and second mask pattern groups of the photo mask by conveyance means, polarizations whose at least one of polarization direction and incidence angle is different are applied to the first and second mask pattern groups of the photo mask by a polarization optical system, and first and second slit alignment regions in different aligned states are alternately formed on the aligned film on the substrate.

In addition, the first mask pattern group of the photo mask has a plurality of first openings elongated in a moving direction of the substrate and formed at a fixed array pitch in a direction crossing the moving direction of the substrate, the second mask pattern group is provided in parallel at a fixed distance in the moving direction of the substrate with respect to the first mask pattern group and has a plurality of second openings elongated in the moving direction of the substrate and formed at the same pitch as the array pitch of the plurality of first openings while shifting the second openings by a half pitch in an array direction, and the first and second slit alignment regions parallel to the moving direction of the substrate are allowed to be alternately formed in a direction crossing the moving direction of the substrate. Consequently, the first and second slit alignment regions crossing the moving direction of the substrate are alternately formed in the moving direction of the substrate.

Moreover, the first and second mask pattern groups of the photo mask have a plurality of openings elongated in a direction crossing the moving direction of the substrate and formed at a fixed array pitch in the moving direction of the substrate and are provided in parallel away from each other in the moving direction of the substrate by a distance which is the integral multiple of half of the array pitch, and the first and second slit alignment regions crossing the moving direction of the substrate are allowed to be alternately formed in the moving direction of the substrate by intermittently applying the polarization for each movement of the substrate by a distance equal to the array pitch. Consequently, the first and second slit alignment regions crossing the moving direction of the substrate are alternately formed in the moving direction of the substrate.

In addition, in the polarization optical system, P polarization is separated into two polarizations by a beam splitter, one of the P polarizations is made to enter a first mask pattern group of the photo mask at a predetermined angle, and the other P polarization is made to enter a second mask pattern group of the photo mask at a different angle from the angle. Consequently, one of the two P polarizations separated by the beam splitter is made to enter the first mask pattern group of the photo mask at a predetermined angle, and the other P polarization is made to enter the second mask pattern group of the photo mask at an angle different from the above angle.

In addition, in the beam splitter, a reflecting surface of the splitter is provided to be disposed in a plane crossing substantially vertical to the photo mask at an intermediate position between the first and second mask pattern groups of the photo mask. Consequently, the P polarization is separated into two directions by a reflecting surface of the beam splitter disposed in a plane substantially vertically crossing the photo mask at an intermediate position of the first and second mask pattern groups of the photo mask.

And then, among two polarizations with different polarization directions, the polarization optical system makes one of the polarizations enter a first mask pattern group of the photo mask and makes the other polarization enter a second mask pattern group of the photo mask. Consequently, one of the two polarizations with different polarization directions is made to enter the first mask pattern group of the photo mask, and the other polarization is made to enter the second mask pattern group of the photo mask.

According to some embodiments, two kinds of slit alignment regions in different aligned states can be formed by a single alignment processing, and the takt time of an alignment processing can be reduced. Since a first mask pattern group forming a first alignment region and a second mask pattern group forming a second alignment region are formed on the same photo mask, the positional accuracy of the first and second alignment regions in different aligned states is enhanced. Further, since the two kinds of the alignment regions in different aligned states can be formed simultaneously by a single apparatus for alignment processing, the cost of the device can be reduced.

According to some embodiments, the first and second slit alignment regions parallel to the moving direction of the substrate can be easily formed by being alternately arranged in a direction crossing the moving direction of the substrate.

According to some embodiments, the first and second slit alignment regions crossing the moving direction of the substrate can be easily formed by being alternately arranged in the moving direction of the substrate.

According to some embodiments, alignment processing of a TFT substrate of a liquid crystal display device and a color filter substrate can be easily performed.

According to some embodiments, a polarization filter for 3D television can be easily manufactured.

According to some embodiments, two P polarizations separated by a beam splitter can be directly applied to the first and second mask pattern groups of the photo mask. Accordingly, the cost of the device can be reduced by reducing the number of components constituting a polarization optical system.

BRIEF DESCRIPTION OF DRAWINGS

FIG. 5A and FIG. 5B are explanatory views showing alignment of liquid crystal molecules in each alignment region of the substrate subjected to the alignment processing, FIG. 5A is a cross-sectional view taken along with a line A-A of FIG. 4, and FIG. 5B is a cross-sectional view taken along with a line B-B of FIG. 4.

FIG. 9A and FIG. 9B are plan views showing an aligned state of a substrate subjected to the alignment processing in the second embodiment, FIG. 9A shows the alignment processing using the photo mask of FIG. 2, and FIG. 9B shows the alignment processing using the photo mask of FIG. 6.

DESCRIPTION OF THE PREFERRED EMBODIMENTS

Figure 1:
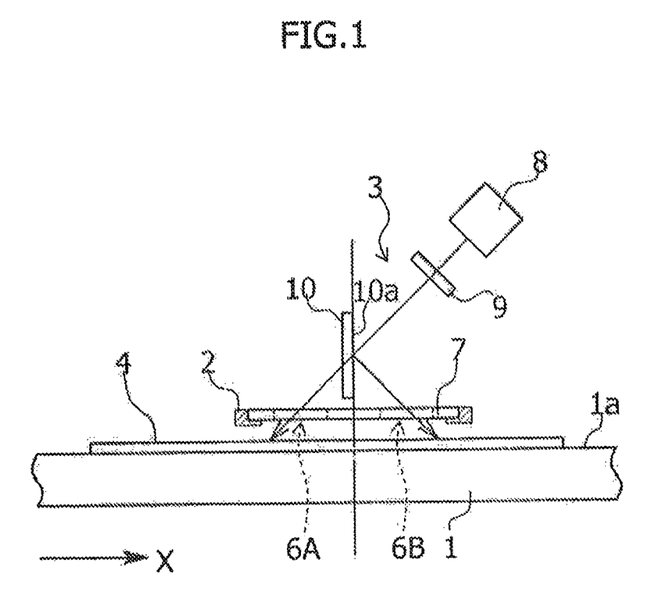
FIG. 1 is a front view showing a schematic constitution of a first embodiment of an apparatus for alignment processing according to the present invention.

Hereinafter, embodiments of the present invention will be described in detail based on the accompanying drawings. FIG. 1 is a front view showing a schematic constitution of a first embodiment of an apparatus for alignment processing according to the present invention. The apparatus for alignment processing alternately forms two kinds of slit alignment regions in different aligned states while moving a substrate and is provided with conveyance means 1, a mask stage 2, and a polarization optical system 3.

In the conveyance means 1, a substrate 4 coated with an aligned film is placed on an upper surface 1a and moved at a constant speed in an X direction in FIG. 1. The conveyance means 1 is provided with a speed sensor and a position sensor (not shown).

The mask stage 2 is disposed to face the upper surface 1a of the conveyance means 1. The mask stage 2 positions and holds a photo mask 7 having a first mask pattern group 6A and a second mask pattern group 6B shown in FIG. 2. In the first mask pattern group 6A, a plurality of openings 5A elongated in the moving direction of the substrate 4 are formed at a fixed array pitch. The second mask pattern group 6B is provided in parallel with the first mask pattern group 6A and has a plurality of openings 5B elongated in the moving direction of the substrate 4 and formed at the same pitch as the array pitch of the openings 5A. The mask stage 2 can slightly move in a plane parallel to the upper surface 1a of the conveyance means 1 in a direction perpendicular to the moving direction of the substrate 4.

Figure 2:
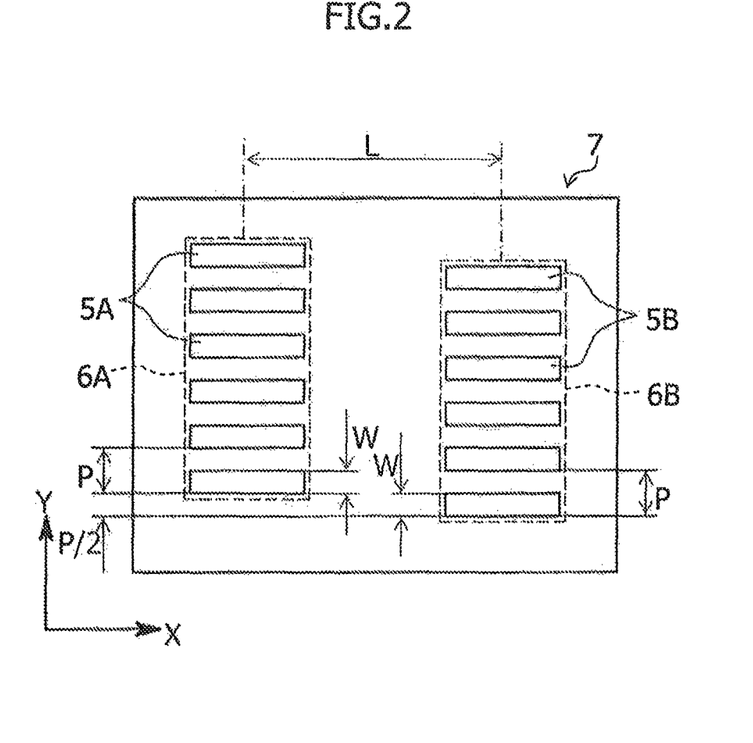
FIG. 2 is a plan view showing one configuration example of a photo mask in use.

In a specific configuration example of the photo mask 7, the first mask pattern group 6A has the plurality of openings 5A formed at an array pitch P in a direction (hereinafter referred to as a "Y direction") crossing the moving direction of the substrate 4 (hereinafter referred to as an "X direction"), and the second mask pattern group 6B is provided in parallel at a centerline-to-centerline distance L in the X direction with respect to the first mask pattern group 6A and has the plurality of openings 5B formed at the same pitch as the array pitch P of the plurality of openings 5A while shifting the openings 5B by a half pitch in the array direction (Y direction). In this case, the distance L is set to a distance that prevents a portion of polarization applied to the first mask pattern group 6A and a portion of polarization applied to the second mask pattern group 6B from being mixed with each other due to leakage to the respective opposite mask pattern groups. The width W in the array direction of each of the openings 5A and 5B is set so that W≤P/2. When it is set that W=P/2, a non-alignment region is not formed between the first alignment region 11 and the second alignment region 12 (see, FIG. 4). In the following description, the case where W=P/2 will be described.

A polarization optical system 3 is provided above the mask stage 2. The polarization optical system 3 applies polarizations such that at least one of polarization direction and incidence angle is different to the first and second mask pattern groups 6A and 6B of the photo mask 7. In the first embodiment, P polarization whose polarization direction is parallel to the X direction is made to enter a mask surface of the photo mask 7 (or the substrate 4 surface) at an angle θ (for example, 45°).

Figure 3:
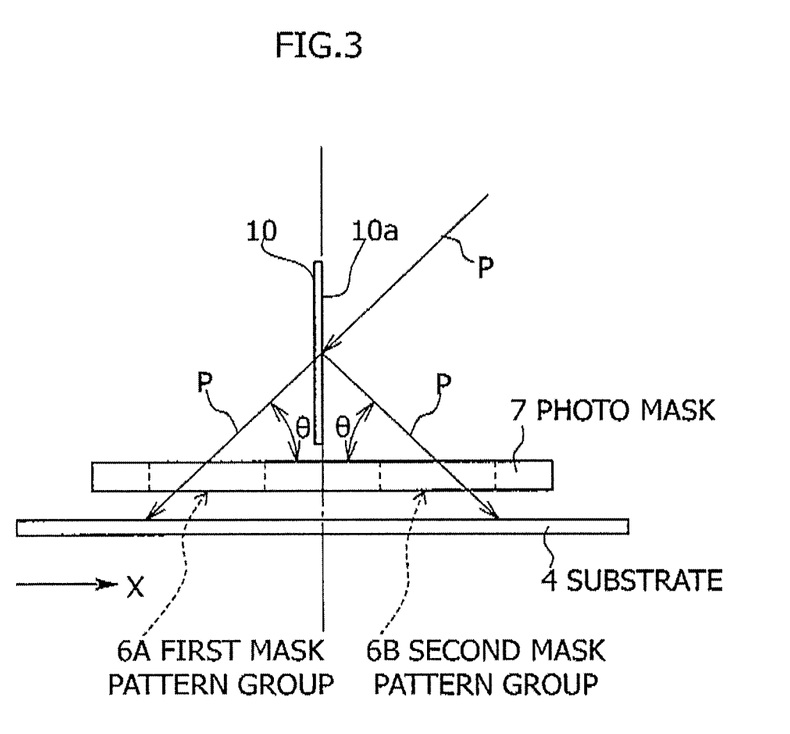
FIG. 3 is an explanatory view showing a method for alignment processing according to the present invention.

In a specific configuration example of the polarization optical system 3, the polarization optical system 3 is provided with a light source 8 of, for example, an extra high pressure mercury lamp emitting ultraviolet light, a polarization plate 9 through which, among random light emitted from the light source 8, the P polarization parallel to an incidence plane is transmitted selectively, and a 50% beam splitter (hereinafter referred to as a "half mirror 10") having a reflecting surface 10a disposed to be inclined relative to an optical axis, transmitting half of the P polarization, and reflecting the remaining half from upstream to downstream in the light advancing direction. In this case, as shown in FIG. 3, when the reflecting surface 10a of the half mirror 10 is disposed in a plane crossing substantially vertical to the photo mask 7 at an intermediate position between the first and second mask pattern groups 6A and 6B of the photo mask 7, the P polarizations separated into two directions can be made to directly enter the first and second mask pattern groups 6A and 6B of the photo mask 7 at different angles θ, and the number of components constituting the polarization optical system 3 can be reduced.

Of course, the respective P polarizations separated into two directions by the reflecting surface 10a of the half mirror 10 are further reflected by a reflecting mirror, whereby the respective P polarizations may be made to enter the first and second mask pattern groups 6A and 6B of the photo mask 7 at different angles θ.

Next, the operation of the apparatus for alignment processing having the above constitution and the method for alignment processing according to the present invention will be described.

First, a color filter substrate (substrate 4), for example, in which an aligned film is formed on a glass substrate by spin coating, spray coating, or the like so as to have a given thickness is positioned and placed on the upper surface 1a of the conveyance means 1 and moved at a constant speed in the X direction.

Subsequently, a reference position (for example, an edge portion parallel to the X direction of each pixel of the color filter substrate) of a reference pattern formed at a constant interval in the X direction is detected by an imaging device (not shown) through a sight glass (not shown) provided at the photo mask 7, detects positional deviation in the Y direction of the reference position of the reference pattern with respect to the reference position previously set in the image device, makes the P polarization of ultraviolet light enter the first and second mask pattern groups 6A and 6B of the photo mask 7 at different incidence angles θ (for example, 45° opposite to each other) by the polarization optical system 3 as shown in FIG. 3 while slightly moving the mask stage 2 in the Y direction so as to correct the positional deviation, and exposes the aligned film on the substrate 4 through each of the openings 5A and 5B of the first and second mask pattern groups 6A and 6B.

Figure 4:
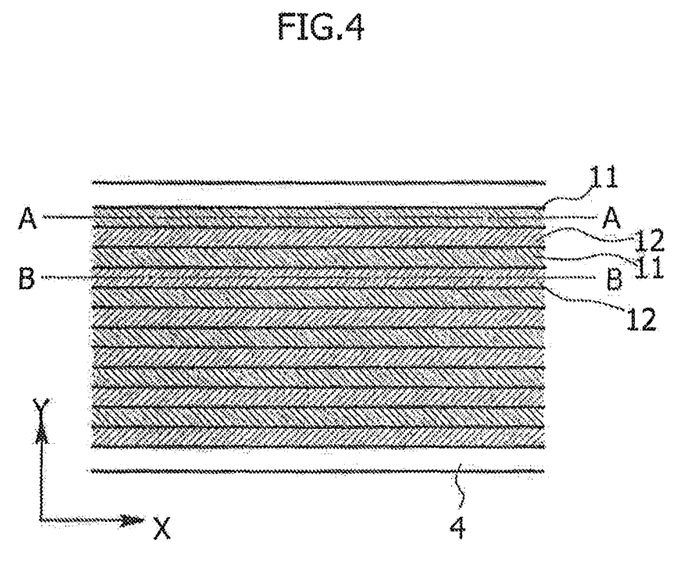
FIG. 4 is a plan view showing an aligned state of a substrate subjected to alignment processing with the use of the photo mask shown in FIG. 2.

According to the above constitution, as shown in FIG. 4, a plurality of first slit alignment regions 11 formed on the aligned film by the first mask pattern group 6A and elongated in the X direction and a plurality of slit second alignment regions 12 which are formed by the second mask pattern group 6B, are in an aligned state different from the aligned state of the first alignment region 11, and are elongated in the X direction are alternately formed on the aligned film in the Y direction.

Figure 5A:
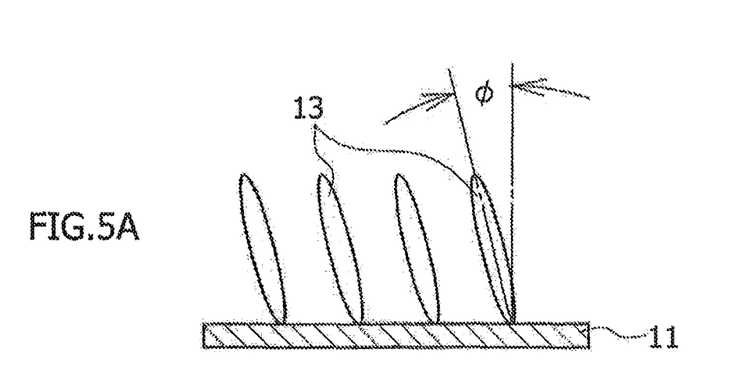

In the case in which, as shown in FIG. 5A, the first alignment region 11 is in a first aligned state in which adjacent liquid crystal molecules 13 are aligned to be tilted by an angle φ (pre-tilt angle (90−φ)) on the left side in FIG. 5A from a vertical state.

Figure 5B:
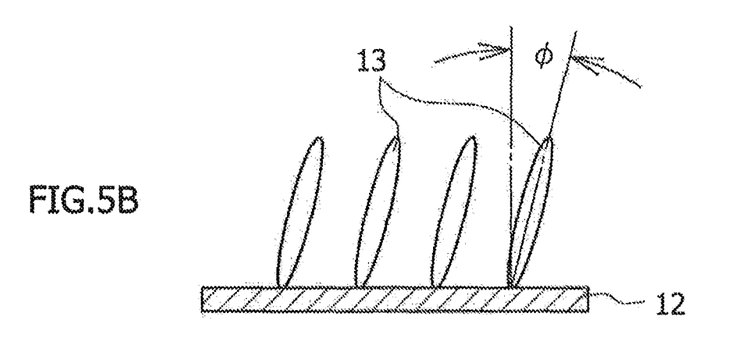

Meanwhile, as shown in FIG. 5B, the second alignment region 12 is in a second aligned state in which the adjacent liquid crystal molecules 13 are aligned to be tilted by the angle φ (pre-tilt angle (90−φ)) on the right side in FIG. 5B from the vertical state.

When the imaging device is a line CCD in which a plurality of light receiving elements are continuously arranged in alignment in the Y direction, position detection can be performed in real time, and positional alignment between the substrate 4 and the photo mask 7 can be performed at high speed.

Figure 6:
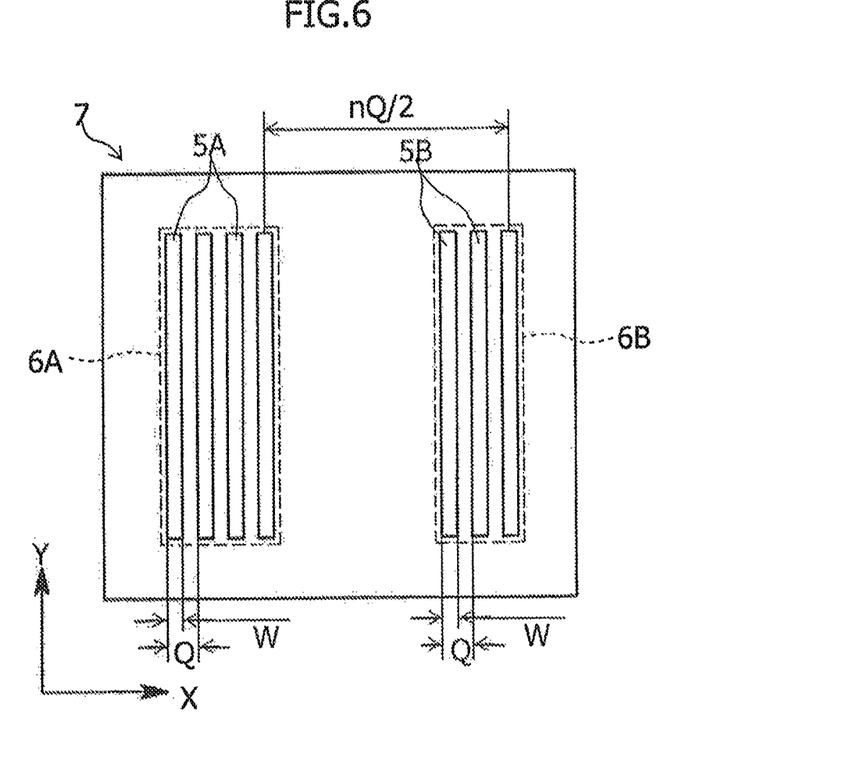
FIG. 6 is a plan view showing a variation of a configuration of a photo mask.
Figure 7:
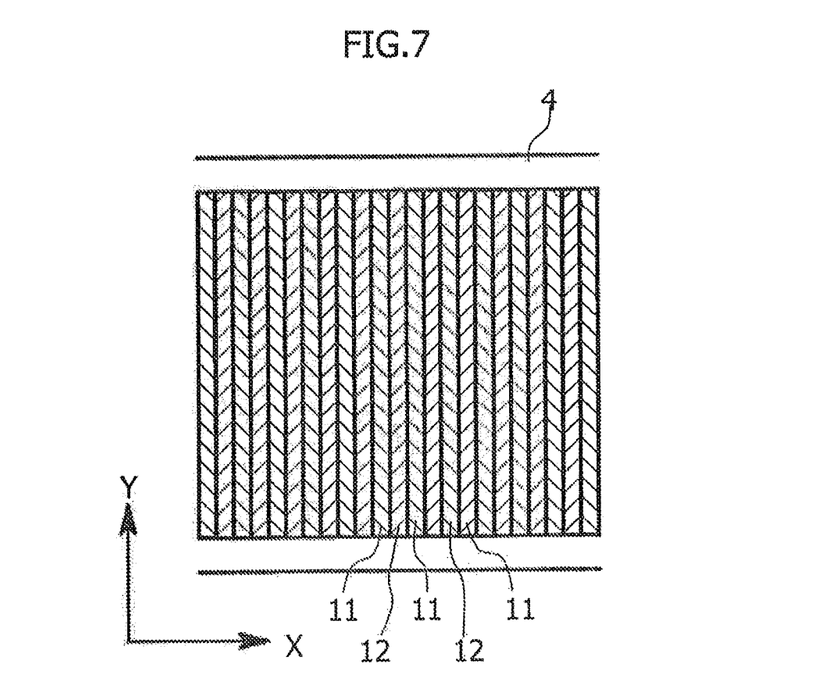
FIG. 7 is a plan view showing an aligned state of a substrate subjected to the alignment processing with the use of the photo mask shown in FIG. 6.

FIG. 6 shows a variation of the photo mask 7. In the photo mask 7, the first and second mask pattern groups 6A and 6B are provided away from each other at a fixed distance in the moving direction of the substrate 4, and the openings 5A and 5B elongated in the Y direction are formed at an array pitch Q in the X direction. In this case, a distance between a longitudinal central axis of the opening 5A on the leading side in the X direction of the first mask pattern group 6A and a longitudinal central axis of the opening 5B on the leading side in the X direction of the second mask pattern group 6B is represented by nQ/2 (n is integer), and when the P polarization is intermittently applied using a flash lamp for each movement of the substrate 4 by a distance equal to the array pitch Q, as shown in FIG. 7, the second alignment region 12 can be formed in a portion between adjacent regions of the plurality of first alignment regions 11, formed by the first mask pattern group 6A, by the second mask pattern group 6B. In this case, since each alignment region is formed by a plurality of number of times of multiple exposures, light energy applied to the substrate 4 can be reduced, and the power of the light source 8 can be reduced. The width W in the array direction of each of the openings 5A and 5B is set so that W≤Q/2. In FIG. 6, it is set that W=Q/2. In this case, as shown in FIG. 7, a non-alignment region is not formed between the first alignment region 11 and the second alignment region 12.

Figure 8:
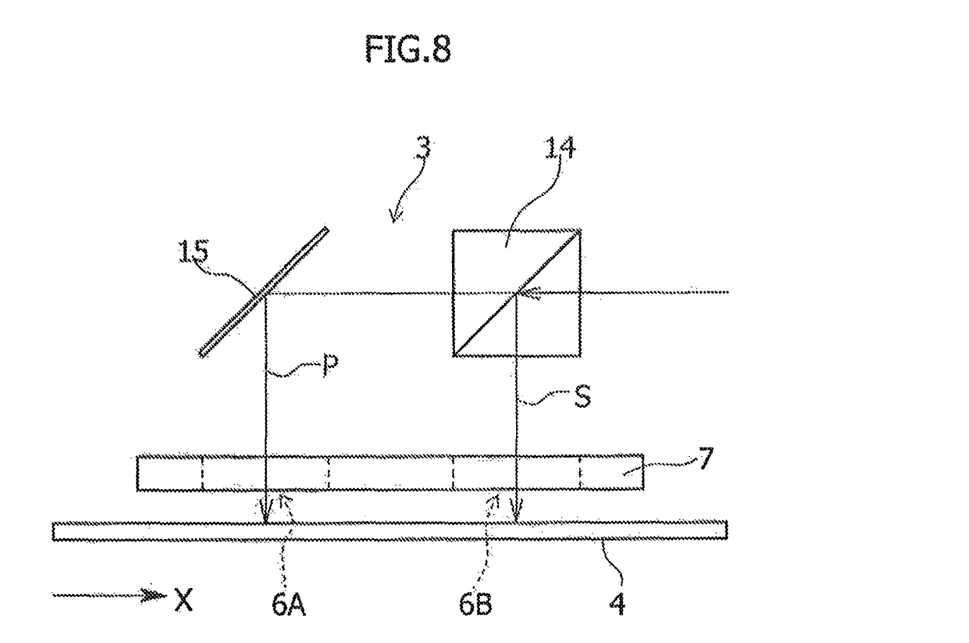
FIG. 8 is an enlarged front view of a relevant portion showing a second embodiment of an apparatus for alignment processing according to the present invention.

FIG. 8 is an enlarged view of a relevant portion showing a second embodiment of the apparatus for alignment processing according to the present invention.

The second embodiment is different from the first embodiment in that among two polarizations (P polarization and S polarization) with different polarization directions separated by a polarization beam splitter 14, a polarization optical system 3 makes one of the polarization (P polarization) enter a first mask pattern group 6A of a photo mask 7 and makes the other polarization (S polarization) enter a second mask pattern group 6B of the photo mask 7. In this case, the incidence angles of the P polarization and the S polarization may be the same or different. FIG. 8 shows a case in which each polarization is made to enter the photo mask 7 vertically. In FIG. 8, reference numeral 15 is a total reflection mirror.

Figure 9A:
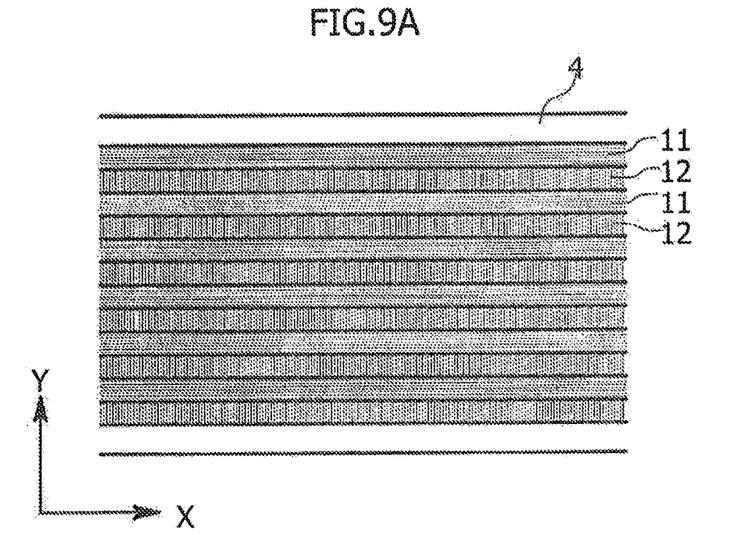
Figure 9B:
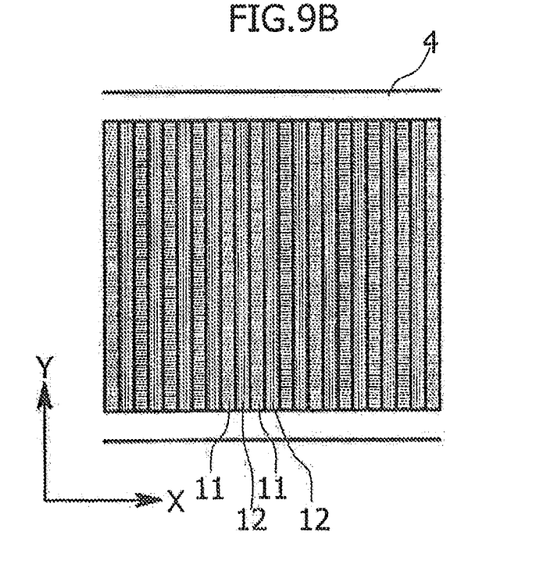

The photo mask 7 used in the second embodiment may be one shown in FIG. 2 or FIG. 6. According to this constitution, as shown in FIG. 9A and FIG. 9B, a plurality of first slit alignment regions 11 and a plurality of slit second alignment regions 12 whose aligned directions are perpendicular to each other are alternately formed. FIG. 9A shows an aligned state of an aligned film in a case in which the photo mask 7 shown in FIG. 2 is used, and FIG. 9B shows an aligned state in a case in which the photo mask 7 shown in FIG. 6 is used.

Figure 10:
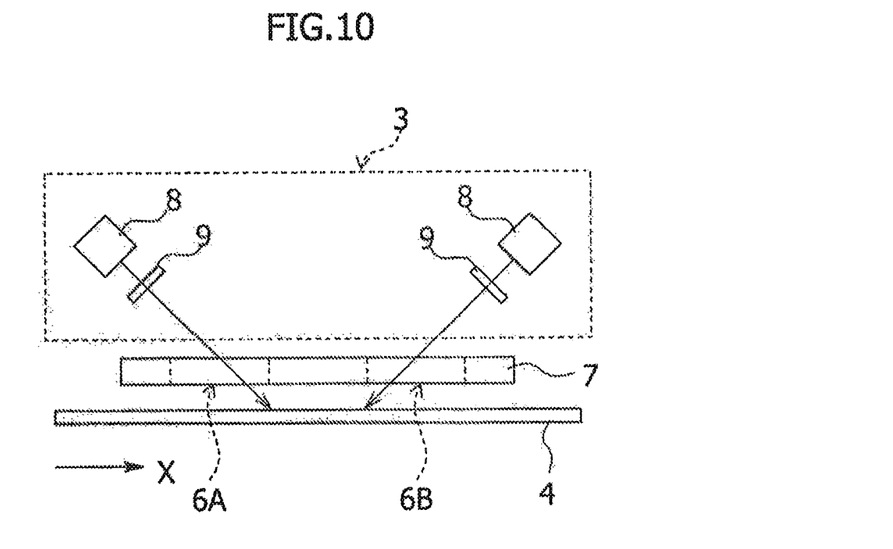
FIG. 10 is a front view showing another configuration example of a polarization optical system.

In the above description, although the light emitted from the single light source 8 is separated into the two P polarizations or the P polarization and the S polarization by the polarization optical system 3, the present invention is not limited to this case, and as shown in FIG. 10, the independent light sources 8 may be provided corresponding to the first and second mask pattern groups 6A and 6B, respectively. In this case, a polarization plate 9 selectively transmitting a predetermined linear polarization from light emitted from the light source 8 is provided in front of each of the light sources 8. When a polarization optical system shown in FIG. 10 is used in the first embodiment, each of the above polarization plates 9 is a polarization plate transmitting the P polarization selectively. When the polarization optical system shown in FIG. 10 is used in the second embodiment, one of the polarization plates 9 selectively transmits the P polarization, and the other polarization plate 9 selectively transmits the S polarization. Further, when the polarization optical system shown in FIG. 10 is used in the second embodiment, each polarization may be made to vertically enter the photo mask 7.

It should be noted that the entire contents of Japanese Patent Application No. 2010-100053, filed on Apr. 23, 2010, on which the convention priority is claimed is incorporated herein by reference.

It should also be understood that many modifications and variations of the described embodiments of the invention will occur to a person having an ordinary skill in the art without departing from the spirit and scope of the present invention as claimed in the appended claims.

What is claimed is:

1. A method for alignment processing comprising:
    making a substrate, coated with an aligned film, closely face a photo mask, which has a first mask pattern group having a plurality of first elongated openings formed at a fixed array pitch and a second mask pattern group provided parallel to the first mask pattern group and having a plurality of second elongated openings formed at the same pitch as the array pitch of the first openings, and moving the substrate in a direction crossing the first and second mask pattern groups;
    directly applying one of two polarizations to the first mask pattern group and directly applying the other to the second mask pattern group, wherein the two polarizations have been separated by a reflecting surface of a beam splitter disposed so that the reflecting surface is provided in a plane crossing vertical to the photo mask at an intermediate position between the first and second mask pattern groups of the photo mask, and the two polarizations are different from each other in at least one of polarization direction and incidence angle; and alternately forming, on the aligned film, first and second slit alignment regions in different aligned states.

2. The method for alignment processing according to claim 1, wherein the first mask pattern group of the photo mask has a plurality of first openings elongated in a moving direction of the substrate and formed at a fixed array pitch in a direction crossing the moving direction of the substrate, the second mask pattern group is provided in parallel at a fixed distance in the moving direction of the substrate with respect to the first mask pattern group and has a plurality of second openings elongated in the moving direction of the substrate and formed at the same pitch as the array pitch of the first openings while shifting the second openings by a half pitch in an array direction, and the first and second slit alignment regions parallel to the moving direction of the substrate are alternately formed in a direction crossing the moving direction of the substrate.

3. The method for alignment processing according to claim 1, wherein the first and second mask pattern groups of the photo mask have a plurality of openings elongated in a direction crossing the moving direction of the substrate and formed at a fixed array pitch in the moving direction of the substrate and are provided in parallel away from each other in the moving direction of the substrate by a distance which is the integral multiple of half of the array pitch, and the first and second slit alignment regions crossing the moving direction of the substrate are alternately formed in the moving direction of the substrate by intermittently applying the polarization for each movement of the substrate by a distance equal to the array pitch.

4. The method for alignment processing according to claim 1, wherein the polarizations applied to the first and second mask pattern groups of the photo mask are P polarizations, and the incidence angles are different from each other.

5. The method for alignment processing according to claim 1, wherein one of the polarizations applied to the first and second mask pattern groups of the photo mask is P polarization, and the other is S polarization.

6. An apparatus for alignment processing comprising:

a conveyance means which places a substrate, coated with an aligned film, on an upper surface of the conveyance means and moves the substrate in a given direction;

a mask stage which is disposed so as to face the upper surface of the conveyance means and holds a photo mask having a first mask pattern group having a plurality of elongated first openings formed at a fixed array pitch and a second mask pattern group provided in parallel with the first mask pattern group and having a plurality of elongated second openings formed at the same pitch as the array pitch of the first openings; and a polarization optical system which directly applies one of two polarizations to the first mask pattern group and directly applies the other to the second mask pattern group, wherein the two polarizations have been separated by a reflecting surface of a beam splitter disposed so that the reflecting surface is provided in a plane crossing vertical to the photo mask at an intermediate position between the first and second mask pattern groups of the photo mask, and the two polarizations are different from each other in at least one of polarization direction and incidence angle, wherein first and second slit alignment regions in different aligned states are allowed to be alternately formed on the aligned film.

7. The apparatus for alignment processing according to claim 6, wherein the first mask pattern group of the photo mask has a plurality of first openings elongated in a moving direction of the substrate and formed at a fixed array pitch in a direction crossing the moving direction of the substrate, the second mask pattern group is provided in parallel at a fixed distance in the moving direction of the substrate with respect to the first mask pattern group and has a plurality of second openings elongated in the moving direction of the substrate and formed at the same pitch as the array pitch of the plurality of first openings while shifting the second openings by a half pitch in an array direction, and the first and second slit alignment regions parallel to the moving direction of the substrate are allowed to be alternately formed in a direction crossing the moving direction of the substrate.

8. The apparatus for alignment processing according to claim 6, wherein the first and second mask pattern groups of the photo mask have a plurality of openings elongated in a direction crossing the moving direction of the substrate and formed at a fixed array pitch in the moving direction of the substrate and are provided in parallel away from each other in the moving direction of the substrate by a distance which is the integral multiple of half of the array pitch, and the first and second slit alignment regions crossing the moving direction of the substrate are allowed to be alternately formed in the moving direction of the substrate by intermittently applying the polarization for each movement of the substrate by a distance equal to the array pitch.

9. The apparatus for alignment processing according to claim 6, wherein in the polarization optical system, P polarization is separated into two polarizations by the beam splitter, one of the P polarizations is made to enter a first mask pattern group of the photo mask at a predetermined angle, and the other P polarization is made to enter a second mask pattern group of the photo mask at a different angle from the angle.

10. The apparatus for alignment processing according to claim 9, wherein among two polarizations with different polarization directions, the polarization optical system makes one of the polarizations enter a first mask pattern group of the photo mask and makes the other polarization enter a second mask pattern group of the photo mask.

* * * * *